(12) United States Patent
Batey et al.

(10) Patent No.: US 6,545,295 B2
(45) Date of Patent: Apr. 8, 2003

(54) TRANSISTOR HAVING AMMONIA FREE NITRIDE BETWEEN ITS GATE ELECTRODE AND GATE INSULATION LAYERS

(75) Inventors: John Batey, Redwood City, CA (US); Peter M. Fryer, Yorktown Heights, NY (US); Jun Hyung Souk, Seoul (KR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/137,923

(22) Filed: May 2, 2002

(65) Prior Publication Data

US 2002/0168878 A1 Nov. 14, 2002

Related U.S. Application Data

(62) Division of application No. 09/658,181, filed on Sep. 8, 2000, now Pat. No. 6,420,282, which is a division of application No. 08/878,342, filed on Jun. 18, 1997, now Pat. No. 6,165,917, which is a division of application No. 08/636,106, filed on Apr. 22, 1996, now Pat. No. 5,831,283.
(60) Provisional application No. 60/007,786, filed on Nov. 30, 1995.

(51) Int. Cl.$^7$ .............................................. H01L 29/00
(52) U.S. Cl. ......................... 257/72; 257/59; 257/347; 257/762; 257/649; 257/350
(58) Field of Search .......................... 257/59, 72, 347, 257/762, 649, 350

(56) References Cited

U.S. PATENT DOCUMENTS

| | | |
|---|---|---|
| 5,053,832 A | 10/1991 | Uchida |
| 5,123,847 A | 6/1992 | Holmberg et al. |
| 5,459,353 A | 10/1995 | Kanazawa |
| 5,477,355 A | 12/1995 | Sasaki et al. |
| 5,495,667 A | 3/1996 | Farnworth et al. |
| 5,539,227 A | 7/1996 | Nakano |
| 5,623,350 A | 4/1997 | Kawachi et al. |
| 5,888,588 A | 3/1999 | Nagabushnam et al. |
| 5,897,346 A | 4/1999 | Yamaguchi et al. |

OTHER PUBLICATIONS

Stanley Wolf Ph.D., et al., "Silicon Processing for the VLSI Era vol. 1: Process Technology," Lattice Press, pp. 190–194 (1986).

*Primary Examiner*—Fetsum Abraham
(74) *Attorney, Agent, or Firm*—Scully, Scott, Murphy & Presser; Daniel P. Morris

(57) ABSTRACT

A thin film transistor and a liquid crystal display panel are provided. These devices include a layer of ammonia-free silicon nitride formed between the gate and the gate insulator of the device.

7 Claims, 2 Drawing Sheets

TRANSISTOR HAVING AMMONIA FREE NITRIDE BETWEEN ITS GATE ELECTRODE AND GATE INSULATION LAYERS

RELATED APPLICATIONS

This application is a divisional application of U.S. application Ser. No. 09/658,181, filed Sep. 8, 2000, now U.S. Pat. No. 6,420,282, which is a divisional application of U.S. application Ser. No. 08/878,342, filed Jun. 18, 1997, now U.S. Pat. No. 6,165,917, which is a divisional application of U.S. application Ser. No. 08/636,106, filed Apr. 22, 1996, now U.S. Pat. No. 5,831,283 which claims benefit of No. 60/007,786 filed Nov. 30, 1995.

FIELD OF THE INVENTION

This invention relates to the passivation of copper, aluminum, and other refractory metals. More particularly, it relates to a method and a structure produced by the method, for passivating a layer of copper on a substrate. It further relates to thin film transistors used in liquid crystal displays and the process of manufacturing the same.

BACKGROUND ART

There have been major difficulties in the use of copper as an electrical connection material in microelectronic circuits. These difficulties relate to the reactive nature of copper. Copper which has been deposited on a substrate will often react with subsequently deposited silicon containing materials and when such reaction occurs, it may delaminate or blister. This is especially significant in the production of liquid crystal displays.

Flat panel liquid crystal displays have been under development for well over a decade. At the present time they are used in laptop computers and other applications where it is desirable to have displays of low volume, low weight and low power consumption. However, various technological difficulties have hampered the production of flat panel liquid crystal displays of any great size.

Liquid crystal displays include a large number of picture elements or pixels arranged in a rectangular array. For example, in a large area liquid crystal display having high resolution, a matrix may be composed of 1280 columns and 1024 rows of pixels. In a color display, each pixel may have three subpixels for the primary colors, and thus there may be a total of nearly four million subpixels. In active matrix liquid crystal displays, each subpixel must be controlled by an active element, preferably a thin film transistor (TFT), which is constructed on a glass substrate.

The thin film transistors must each in turn be controlled by appropriate electronic circuitry which drives the display. In active matrix displays each thin film transistor is connected to a gate control line (for a row of pixels) and a drain control line (for a column of pixels).

Liquid crystal displays used in such applications as portable televisions and laptop computers are generally illuminated by backlighting. A well-known problem is that only a small percentage (typically approximately three percent) of the light generated by the backlight gets through the liquid crystal display to the user. This is in part due to color filters associated with the pixels, but it is also due in large measure to the presence of the thin film transistors and the control lines extending from the edges of the panel to the thin film transistors. To the extent that the lines can be made more conductive, such as having gate lines made of highly conductive metals, the gate lines can be more narrow and a higher percentage of light may be transmitted through the liquid crystal panel.

As an alternative to using wider gate lines, which have the disadvantage noted above with respect to light transmission, it is possible to use thicker gate lines. However, thicker gate lines significantly increase the probability of producing so-called "crossover defects" during subsequent processing. In this processing the TFT structure is fabricated over the gate line, and the increased thickness leads to shorts or discontinuities that adversely affect the structure and therefore the operation of the TFT.

Materials which have been used for gate lines include molybdenum, chromium, and a molybdenum-tantalum alloy. While some success has been achieved, these materials are not sufficiently conductive. The short gate line pulses that are provided by the display driver chips located on the periphery of the liquid crystal display are attenuated due to the resistance and changed in shape in travelling from the edge of the display to its interior and the edge of the display opposite the driver chip. This gate line pulse distortion results in non-uniformity of display brightness, reduction of gray scale display capability (i.e. lack of contrast in some areas and therefore lack of uniformity in contrast across the display) and often produces noticeable flicker.

Until the present time, it has not generally been possible to use the most conductive material, copper, to form the gate lines to the thin film transistors on a liquid crystal display panel. This is because copper is very reactive with the subsequent layers of silicon dioxide or silicon nitride that must be placed over the portions of the copper gate lines which act as the gates of the TFT's, In the case of silicon dioxide, delamination of the oxide film from the copper occurs. In the case of conventional silicon nitride the nitride film, and under certain conditions the copper, will blister. In addition, copper adhesion to glass substrates is often poor.

One solution to the copper adhesion problem is to increase the adhesion between copper and glass by using an adhesion layer such as chromium or titanium between the glass substrate and the copper line. However, this additional step increases cost, and does not address the main problem of reactivity and delamination when silicon dioxide or a conventional silicon nitride film is used over the copper to fabricate the gate insulator of the TFT.

One approach which directly addresses the copper reactivity problem is to deposit a copper line on the glass substrate and to encase or cap the copper line in another material, such as tantalum. Using this approach, a copper layer must be deposited and patterned using, for example, standard photoresist techniques. Then a layer of tantalum must be deposited and this layer must also be patterned. Those additional steps add considerable cost to the production process and increase the width of the gate line.

When an adhesion layer or a capping technique are used, the probability of crossover defects may also be increased due to the increased gate line thickness.

Thus, it would be highly advantageous to be able to form a liquid crystal display including thin film transistors having copper gate lines (and therefore copper gates) directly on a glass substrate without the need for an additional encapsulating protective metal such as Ta.

SUMMARY OF THE INVENTION

It is a principal object of the invention to provide a method for passivating copper, aluminum, or other refractory metals deposited on a substrate and a structure produced by the method.

It is another object of the invention to provide a liquid crystal display panel including thin film transistors which have copper deposited directly on a glass substrate.

It is still another object of the invention to provide a method of producing such liquid crystal displays.

It is a further object of the invention to provide a liquid crystal display including thin film transistors, and a method of making the same, wherein the copper gate has adequate adhesion to the glass layer without the use of an intermediate adhesion layer.

It is an additional object of the invention to provide a liquid crystal display including thin film transistors and a method of making the same, wherein copper may be deposited without a metal capping layer.

It is yet another object of the present invention to provide a structure and method for connecting copper gate lines to aluminum conductors.

In broad terms, the invention comprises the process of depositing a layer of ammonia-free silicon nitride over a layer of copper, aluminum, or another refractory metal deposited on a substrate. The invention also provides a three layer structure which comprises a substrate, a metal layer deposited on the substrate, and a passivating layer of ammonia-free silicon nitride on the metal layer. The structure may have a fourth layer over the passivating layer with the latter acting to prevent reaction of the copper with the fourth layer.

In accordance with the invention, in a liquid crystal display including a thin film transistor constructed on a glass substrate wherein the thin film transistor has a gate, a source and a drain, and a gate insulator between the gate and an active silicon layer, the improvement comprises the gate being copper deposited directly on the substrate and a layer of ammonia-free silicon nitride disposed between the copper gate and the subsequent insulating and active layers. Also in accordance with the invention, the ammonia-free silicon nitride layer also extends to portions of the substrate adjacent the copper gate.

The invention also contemplates a process for constructing a liquid crystal display, and in particular the thin film transistors therein on a substrate. Thin film transistors include a source, a gate, a drain and a gate insulator between the gate and an active silicon layer. In accordance with the invention, the improvement comprises depositing copper, aluminum, or another refractory metal directly on the substrate to form the gate and depositing a layer of ammonia-free silicon nitride between the gate and the gate insulator. Also in accordance with the process, the layer of ammonia-free silicon nitride extends to cover portions of the substrate adjacent the gate.

Also in accordance with the invention, in the case of copper gate, a structure and process for electrically connecting aluminum data metal (source/drain connections) to copper gate metal is provided, which uses a conduction material as a bridge, such as indium oxide or indium tin oxide. In accordance with the process, the conductive material which is preferably a layer of indium tin oxide is deposited on a portion of a substrate. A layer of copper is then deposited, so that it is in contact with a portion of the layer of conductive material, and a layer of metallization made of aluminum and/or molybdenum is then deposited, so that it contacts the conductive material. Prior to depositing the metallization, it is preferable to deposit a passivating layer over the copper, and to etch a via hole in the passivating layer to reach the conductive material, so that when the metallization layer is deposited, it extends through the via hole and makes an electrical connection to the conductive material. The passivating layer is ammonia-free silicon nitride, in accordance with the invention.

DETAILED DESCRIPTION OF THE PREFERRED EMBODIMENT

Figure 1:
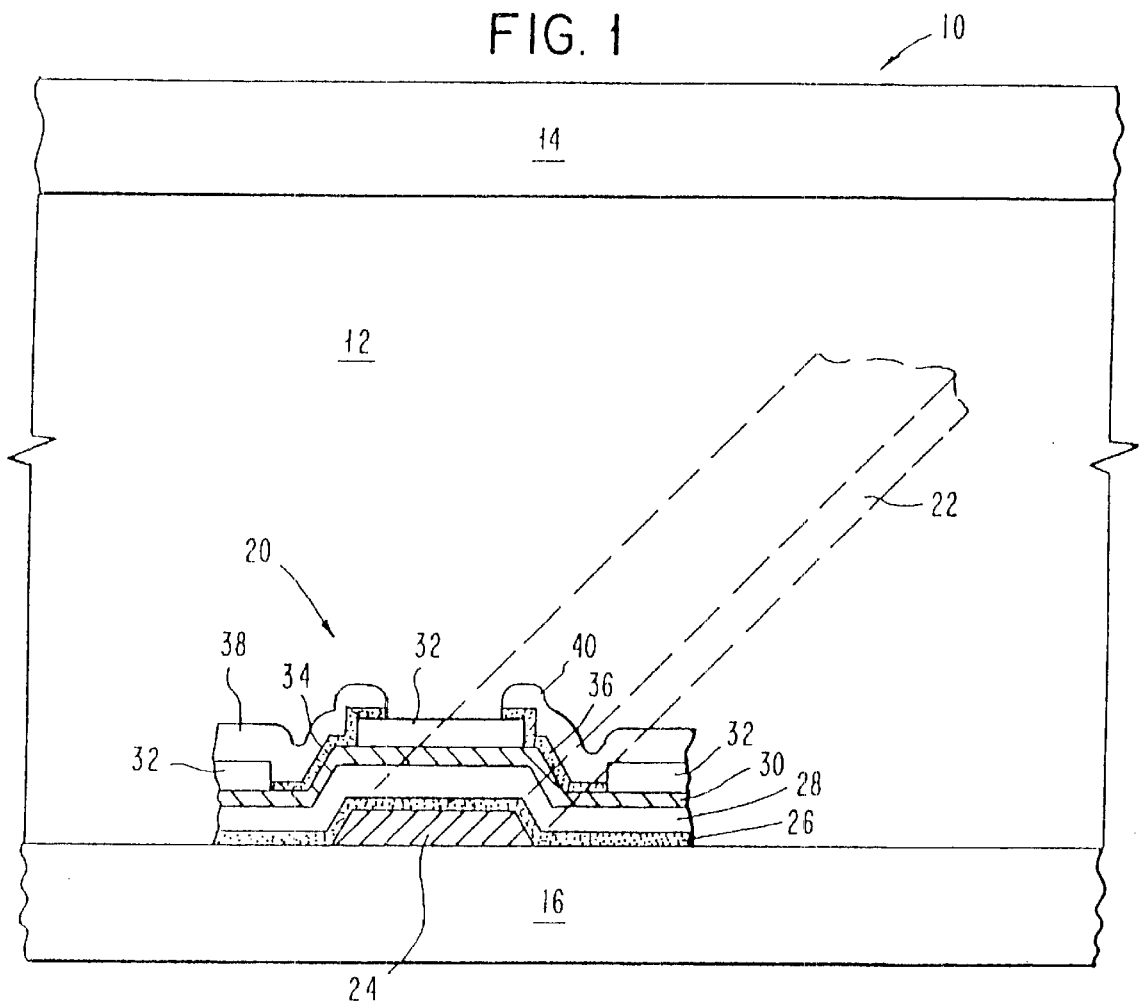
FIG. 1 is an enlarged cross-sectional view of a liquid crystal display, including a thin film transistor formed on a substrate thereof.

In FIG. 1, a liquid crystal display panel 10 includes a liquid crystal material 12 between a first glass substrate 14 and a second glass substrate 16. As is well known in the art, glass substrate 14 has on its lower surface suitable electrodes (not shown), generally of indium tin oxide (ITO) and a rubbed or non-rubbed orientation layer (also not shown) in contact with liquid crystal material 12, for orienting molecules of liquid crystal material 12. Glass substrate 16 also has on its inner surface suitable electrodes and an orientation layer (both not shown).

As described above, substrate 16, which may be formed from Corning 7059 glass has, fabricated thereon, a thin film transistor (TFT), shown generally as 20, for each subpixel of liquid crystal display 10. Also as described above, a gate line 22 extends from TFT 20 to a gate driver circuit (not shown) located at the periphery of liquid crystal display panel 10. It will be understood that although gate line 22 is shown extending at an angle from TFT 20, it is in fact disposed on the inner surface of substrate 16 and extends in a direction perpendicular to the plane of the paper.

While the liquid crystal display is shown in FIG. 1 as being assembled, with liquid crystal material 12 between substrates 14 and 16, it will be understood by those skilled in the art that the substrates are separately prepared, with appropriate electrodes, orientation layers, and in the case of substrate 16, TFT's 20, before they are assembled together in close parallel relationship and the space therebetween filled with liquid crystal material 12.

The first step in the preparation of substrate 16 is to clean the substrate for the subsequent deposition steps. This is accomplished by well-known techniques such as brush cleaning with detergent followed by deionized water jet cleaning.

The next step is the sputter deposit of transparent electrodes such as indium tin oxide (ITO) of a thickness of approximately 1000 angstroms. The ITO is patterned using conventional lithography methods.

After the deposition of the ITO, the next step is the sputter deposition of a copper film having a thickness of approximately 1000 angstroms or greater. A sputtering target of 99.999% pure copper is used. This is done in a conventional in-line sputter deposition apparatus such as Leybold Heraeus Model Z600 under conditions of high energy, relatively low temperature and rapid scanning. The copper is deposited on the cleaned substrate 16 using run parameters of two kilowatts direct current (KWDC) sputter power, 90 standard cubic centimeters/minute (sccm) argon flow rate with multiple scans under a stationary target. Alternatively, a Balzers Model VIS350 in-line system in which one pass is made at a scan speed of 1500 millimeters/minute is used. The sputtering is done at a pressure of 0.03 millibars with a gas flow rate of 10 sccm argon with a target power of 8 KW. The substrate, initially at room temperature, is heated in the load lock before deposition at 250 degrees C. for a period of 10 minutes. In either case, typical resistivity of films deposited is 2 microohm-cm. The material has a stress of $5 \times 10^9$ dynes/cm$^2$ and adhesion to glass substrate 16 is relatively good.

It will be understood that other process conditions may be used. For example in a manufacturing environment, it is desirable to utilize a single pass at a lower scan rate and to adjust the other process conditions accordingly.

After the copper has been deposited, it is patterned, using conventional photoresist techniques, into the appropriate configuration to produce gate lines 22. This process is well known in the art.

These conditions will produce reasonable adhesion of the copper to the glass substrate. However, if the usual process of applying a conventional silicon nitride or silicon dioxide gate insulator were used over copper gate line 22, copper could react adversely with the insulator and the insulator could blister or peel from the copper gate. Fabrication of devices thereon would not be possible.

In accordance with the invention, a non-conventional, ammonia-free silicon nitride layer 26 having a thickness of at least 200 angstroms, and preferably approximately 400 angstroms is deposited over the copper gate 24 (which is a portion of gate line 22) and over regions of substrate 16 surrounding gate 24. By ammonia-free, it is meant no ammonia is used in the PECVD process. Still, there may be trace amounts of ammonia present, but in any event the concentration of ammonia should be less than 500 part per million and preferable less than 200 parts per million.

Ammonia-free silicon nitride layer 26 is formed by plasma-enhanced chemical vapor deposition (PECVD) in a tool manufactured by TEL using a gas mixture of 20 sccm SiH$_4$, 2700 sccm N$_2$, 2000 sccm Hz and 2000 sccm He processed at 250° C. A gas pressure of 0.75 torr and a radio frequency (RF) power level of 375 watts over an electrode area of 1600 cm$^2$ is used. The deposition rate using these conditions is about 260 angstroms/minute. The etch rate using a buffered oxide etchant is measured as 400 angstroms/minute and the material has a refractive index of 1.945.

The ammonia-free silicon nitride layer deposited in this manner showed a very low film stress of approximately $2.45 \times 10^8$ dyne/cm$^2$ tensile on the glass substrate 16, and good adhesion to the copper gate 24.

Although the reasons for why these process conditions are particularly effective in producing a layer which passivates the copper so that it does not react with a subsequently deposited gate insulator are not entirely understood, it is believed that the dilution of the silane and nitrogen, and in particular the nitrogen, by the presence of a large percentage of hydrogen and helium gas, produces silicon nitride which does not contain excess silicon. The presence of helium is believed to enhance the excitation of the nitrogen, resulting in a greater concentration of nitrogen in the silicon nitride film. Therefore hydrogen atoms are bonded almost exclusively to nitrogen atoms, rather than silicon atoms. Varying the gas concentrations significantly from those stated above renders the resulting silicon nitride film inoperative to passivate the copper, and make it impossible to reliably produce TFT's 20.

Figure 2:
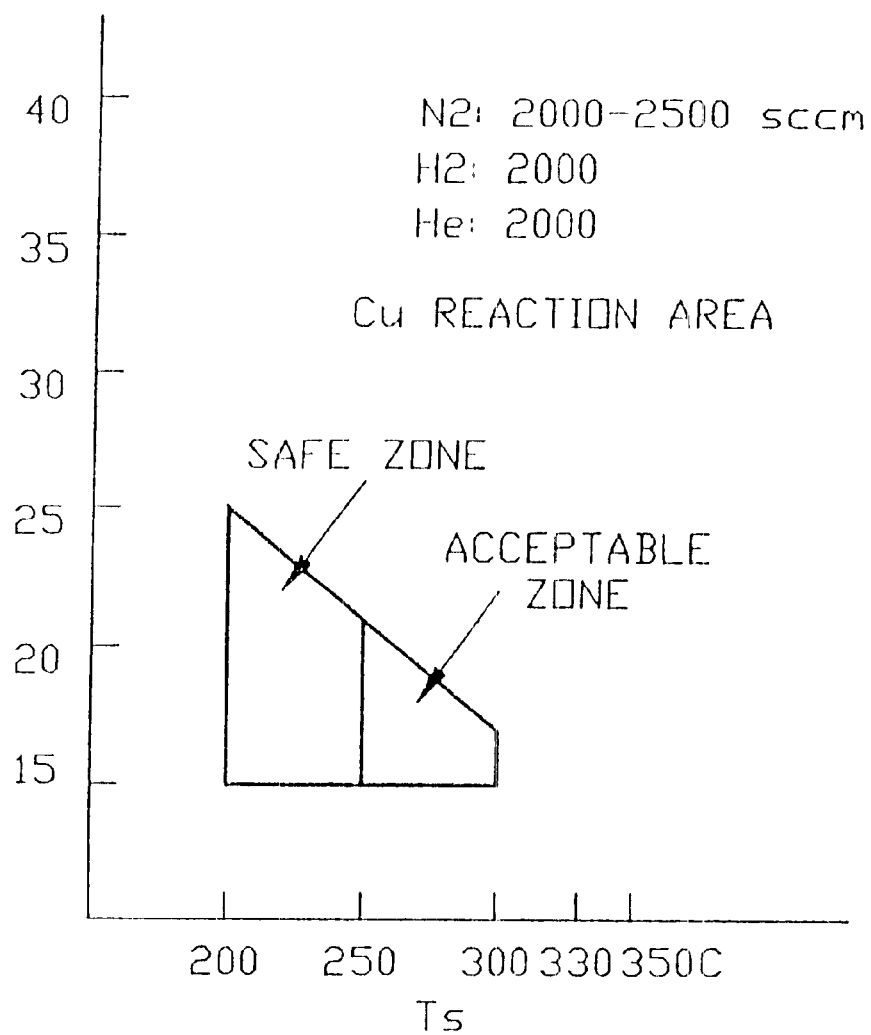
FIG. 2 is a graph which illustrates a process window for the deposition of copper in accordance with the invention.

By way of further explanation, it should be noted that there is a wide range of silicon nitride which is produced by PECVD using silane, nitrogen, hydrogen and helium. However, the optimum process conditions for producing a passivation layer are developed based on the following criteria: First, the resulting material should not react with copper. Therefore a nitrogen-rich composition is preferred. Second, the material should provide a high density, effective diffusion barrier between the copper and the gate insulator. Based on these considerations, in general, low flow rate of silane and a high flow rate of nitrogen and helium are required. A process window is defined in FIG. 2, including a safe zone and an acceptable zone on a plot of SiH$_4$ flow rate and substrate temperature, which are the principal variables determining copper quality. To avoid adverse copper reaction, a flow rate for SiH$_4$ should be in the range of 15 to 25 sccm diluted with a flow rate of hydrogen which is approximately one hundred times as large. A safe temperature range is between two hundred and 250 degrees C. Lowering the temperature to 200 degrees C. with the gas mixture set forth above provides a more stable process window. However, 250 degrees C. is acceptable if adhesion between the copper and the indium tin oxide is good.

If the sputtering conditions for the deposition of the copper are not ideal, the deposited copper gate lines 22 may not have smooth surfaces. In this case, it may be necessary to deposit a slightly thicker layer 26 of ammonia-free silicon nitride in order to assure complete passivation (i.e. to assure that the copper does not extend through layer 26 to gate insulator layer 28). However, it is not believed that layer 26 can replace the entire gate insulator (i.e. occupy the entire space between the copper gate 24 and the active silicon layer 30) because its electrical insulation properties are not believed to be adequate for this purpose.

After the ammonia-free silicon nitride layer 26 has been deposited, a conventional gate insulator layer 28 is deposited. This may be silicon oxide or silicon nitride using a conventional silane and nitrous oxide or a silane and ammonia process, as is well known in the art. This subsequent deposition step may be performed in the same chamber as that used to deposit the ammonia-free silicon nitride layer 26 and may be performed immediately thereafter. If appropriate, the process conditions may be changed so as to optimize the formation of the gate insulator, in a manner well known in the art. No extra etching step or extra photomask step is required. It is merely necessary to change the mixture of gasses in the PECVD chamber.

After gate insulator layer 28 has been deposited, an active silicon layer 30 is deposited by chemical vapor deposition, in a manner well known in the art. Generally, this is an amorphous silicon layer, which forms the active silicon region of TFT 20.

The next step in the process is the deposition of a conventional silicon nitride passivation layer, as is well known in the art, by chemical vapor deposition. Although this layer is initially continuous, etching is performed down to silicon layer 30 to produce via holes. Next, n+ amorphous silicon is deposited in the via holes to form source contact 34 and drain con tact 36. Source and drain line patterns are then deposited to form a metal source line 38 and a metal drain line 40, which are preferably a layered structure consisting of a thick aluminum layer over a thin molybdenum layer. Typically source line 38 electrically connects the source of TFT 20 to a respective subpixel electrode area, while drain line 40 extends to the periphery of the display to connect the drain of TFT 20 to a driver circuit (not shown) located at the periphery.

As a final step, channel etching of the metallization layer which produces source lead 38 and drain lead 40, as well as the silicon layer which produces source contact 34 and drain contact 36, down to layer 32 is conducted to produce etch region 44. This is achieved through conventional photolithography and either wet or dry etching techniques. TFT 20 produced in accordance with the present invention including the layer of ammonia-free silicon nitride has characteristics which are comparable to a TFT produced by conventional processes. In particular a typical plot of drain current versus gate bias current for the copper gate transistor of the present invention is virtually identical to that of a conventional TFT transistor.

A problem associated with the use of copper gate lines is the difficulty of electrically connecting directly to metallization layers generally used at the periphery of the display for electrical connection to power conductors, display drivers and other components. The use of aluminum and/or molybdenum in this location is not at all critical because no light is transmitted, and TFT's are not fabricated in this portion of the display panel. As a result, the lines can be wider and thicker to provide the necessary electrical conductivity.

Figure 3:
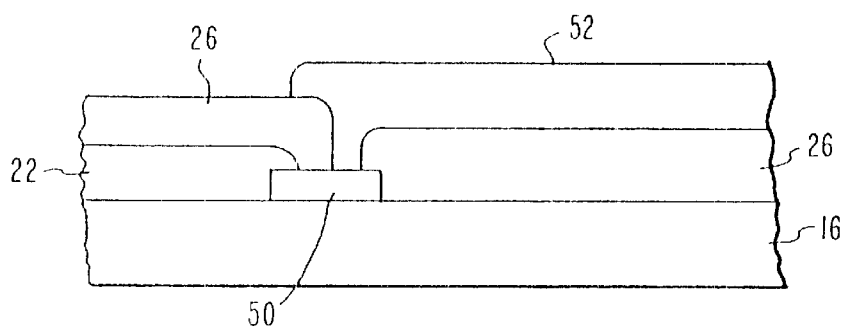
FIG. 3 is an enlarged cross-sectional view of a structure for making an electrical connection between copper gate metal and aluminum data metal.

It has been found to be exceedingly difficult to establish a stable and low-resistance contact between deposited layers of copper gate metal, and aluminum data metal or copper gate metal and molybdenum data metal. After via hole etching with hydrofluoric acid, an electrical contact directly between copper and the metallizing layer results in a connection which deteriorates over time to the extent that unacceptably high contact resistance develops. In order to overcome this difficulty, it has been found expedient to use indium tin oxide as a bridge between the copper gate metal and the aluminum data metal. Referring to FIG. 3, when the ITO electrodes of the pixels or subpixels of the display are deposited on the substrate, appropriate connection pads 50 are also deposited in the lead area of the display (located on the periphery thereof). The copper gate lines 22 are then patterned using a mask which causes the ends thereof to extend over a portion of the pads 50. It will be understood that the ammonia-free silicon nitride layer 26 is deposited over the entire substrate 16 during fabrication of an LCD panel. Via holes are then etched, by conventional techniques, in the ammonia-free silicon nitride layer 26 down to pads 50. Metallization is then performed in a manner well known in the art. This can be accomplished at the same time as source lead 38 and drain lead 40 are deposited.

It will thus be appreciated that in the structure of FIG. 3 ITO pad 50 acts as a bridge between copper gate line 22 the metallization layer (in this case aluminum conductor 52), thus advantageously providing a stable, low resistance conduction path between the gate line 22 and conductor 52.

Thus, in accordance with the invention, an effective passivation material for copper, aluminum, and other refractory metals deposited on a substrate may be produced. The substrate may be glass or other material, such as, for example, a polymer, such as a polyimide, or silicon. As an application of this material, a liquid crystal display panel including thin film transistors using a copper gate can be built without utilizing extra process steps such as adhesion layers, metal capping layers, extra photomask sets and extra etching steps which render such processes unduly expensive and therefore not practical. The thin film transistor structures with the copper gate lines provide many advantages over conventional gate metallurgy in terms of the light transmission capabilities (which may be increased by at least a factor of two) and general performance of the liquid crystal display. Further, in accordance with the invention, extra processing steps are not required and in-line sputtering may be used along with a thin layer of ammonia-free silicon nitride to provide an effective barrier for copper/insulator reaction. Significantly, as noted above, the thin film transistors produced in this manner have characteristics virtually identical to those of conventional thin film transistors.

The TFT formed in accordance with the invention is of the inverted gate structure, with the gate contacting the substrate, which is the most commonly used structure in the industry. It will be recognized that the invention may also be applied to non-inverted structures, with the result that copper (rather than aluminum or molybdenum) source and drain conductors contact the substrate. However, it will be understood that the conductivity of these conductors is not as critical as that of the gate lines, which must conduct short pulses without significant distortion to assure acceptable display operation.

While this invention has been described in connection with the preferred embodiment, it will be understood that those with skill in the art may be able to develop variations of the disclosed embodiment without departing from the spirit of the invention or the scope of the following claims. For example, other gate metals, such as aluminum and other refractory metals, may be used instead of copper.

We claim:

1. In a thin film transistor constructed on a substrate, the thin film transistor having a gate, a source and a drain, and a gate insulator between the gate and an active silicon layer, the improvement comprising:
  a layer of ammonia-free silicon nitride deposited between said copper, aluminum, or other refractory metal gate and said gate insulator.

2. The thin film transistor of claim 1 wherein the gate is copper, aluminum, or another refractory layer deposited directly on said substrate.

3. The thin film transistor of claim 1 wherein the layer of ammonia-free silicon nitride is also deposited on portions of said substrate adjacent said gate.

4. In a liquid crystal display panel including a plurality of thin film transistors deposited on a substrate, the thin film transistors each having a gate, a source and a drain, and a gate insulator between the gate and an active silicon layer, the improvement comprising:
  a layer of ammonia-free silicon nitride deposited between said copper, aluminum, or other refractory metal gate and said gate insulator.

5. The liquid crystal display of claim 4 wherein the gate is copper, aluminum, or other refractory metal deposited directly on said substrate.

6. The liquid crystal display of claim 4 wherein said gate is part of a gate line on said substrate and said layer of ammonia-free silicon nitride is also deposited on portions of said substrate adjacent said gate line.

7. The liquid crystal display of claim 4 wherein said layer of ammonia-free silicon nitride is at least 200 angstroms thick.

* * * * *